United States Patent [19]

Munemasa et al.

[11] Patent Number: 5,269,896

[45] Date of Patent: Dec. 14, 1993

[54] CATHODIC ARC DEPOSITION SYSTEM

[75] Inventors: Jun Munemasa; Tadashi Kumakiri; Tatsuya Tanaka, all of Kobe, Japan

[73] Assignee: Kabushiki Kaisha Kobe Seiko Sho, Kobe, Japan

[21] Appl. No.: 889,422

[22] Filed: May 28, 1992

[30] Foreign Application Priority Data

May 29, 1991 [JP] Japan .................. 3-125953
May 29, 1991 [JP] Japan .................. 3-125954

[51] Int. Cl.$^5$ .................................. C23C 14/32
[52] U.S. Cl. .................. 204/192.38; 204/298.11; 204/298.41; 427/540
[58] Field of Search .............. 204/192.38, 298.11, 204/298.41; 427/540

[56] References Cited

U.S. PATENT DOCUMENTS

| | | | |
|---|---|---|---|
| 4,556,471 | 12/1985 | Bergman et al. | 204/298.41 |
| 4,559,121 | 12/1985 | Mularie | |
| 4,929,322 | 5/1990 | Sue et al. | 204/192.38 |
| 5,096,558 | 3/1992 | Ehrich | 204/192.38 |
| 5,103,766 | 4/1992 | Yoshikawa et al. | 118/723 |
| 5,126,030 | 6/1992 | Tamagaki et al. | 204/192.38 |

FOREIGN PATENT DOCUMENTS

| | | |
|---|---|---|
| 0158972 | 10/1985 | European Pat. Off. . |
| 0277341 | 8/1988 | European Pat. Off. . |
| 293146 | 8/1991 | German Democratic Rep. ......................... 204/298.41 |
| 1-240645 | 9/1989 | Japan ........................ 204/298.41 |
| 1-263265 | 10/1989 | Japan ........................ 204/298.41 |
| 1-164756 | 11/1989 | Japan ........................ 204/298.41 |

OTHER PUBLICATIONS

Patent Abstracts of Japan, vol. 12, No. 126 (M-687), Apr. 19, 1988, and JP-A-62-252-679, Nov. 4, 1987, R. Nakane, "Arc Length Control Device for Welding Machine".

Patent Abstracts of Japan, vol. 9, No. 171 (C-291), Jul. 16, 1985, and JP-A-60-043-482, Mar. 8, 1985, T. Takeuchi, et al., "Sputtering Device".

*Primary Examiner*—Aaron Weisstuch
*Attorney, Agent, or Firm*—Oblon, Spivak, McClelland, Maier & Neustadt

[57] ABSTRACT

A cathodic arc deposition system includes a cathode made of a film forming material, a shield surrounding a circumferential side of the cathode with a gap, a vacuum chamber having the cathode and the shield therein, and a substrate to have deposited at a surface thereof an ionized film forming material by generating an arc discharge between the cathode and the anode. Either the cathode or the shield is adjusted in height so as to keep the upper edge of the shield at substantially the same vertical level as the upper edge of the cathode.

13 Claims, 6 Drawing Sheets

CATHODIC ARC DEPOSITION SYSTEM

BACKGROUND OF THE INVENTION

1. Field of the Invention

The present invention concerns a cathodic arc deposition system used for coating, for example, an abrasion resistant film composed of TiN or the like onto the surface of tool steels.

2. Description of the Prior Art

A cathodic arc deposition system (also referred to as a vacuum arc ion plating system) is adapted to deposit an ionized film-forming material onto the surface of a substrate applied with a negative bias voltage by evaporating the film-forming material from an evaporation surface of a cathode comprising the film-forming material by means of arc discharge and ionizing the material, in a vacuum chamber.

In this case, since an arc spot is formed on the evaporation surface of the cathode by arc discharge, and the spot moves around at random during violent evaporation and ionization of the cathode material comprising the film-forming material, a shield is disposed for preventing the arc spot from shifting from the evaporation surface of the cathode to a non-evaporation surface (such as on the circumferential side of the cathode).

An apparatus having an arc evaporation source comprising a cathode or the like provided with a shield for preventing the shift of the arc spot and adapted to evaporate the cathode substance and deposit it on the surface of a substrate by utilizing the arc discharge is known, for example, as disclosed in Japanese patent Publication Sho 52-14690. FIG. 9 is an explanatory cross sectional view of the constitution of an arc evaporation source in a cathodic metal arc deposition system of the prior art.

In FIG. 9, a vacuum chamber wall 71 contains a cylindrical conductor 72 (having an axial line A) attached thereto by way of a ceramic insulator 73 and has an upper surface protruding into the chamber 71. An electroconductive cooling plate 74 which is internally cooled, is fixed to the upper surface of the conductor 72. Further, a disc-shaped cathode 75 is fixed to the upper surface of the cooling plate 74. The cooling plate 74 and the cathode 75 are disposed on the conductor 72 with each of their axial lines (center lines) being aligned with the axial line A.

The cathode 75 is made of a metal material for forming a film, and the upper surface thereof constitutes an evaporation surface 751. Numeral 76 denotes a cylindrical shield that surrounds the circumferential side of the cathode 75 with a gap G of about 2 to 3 mm, with the axial line thereof being aligned with the axial line A of the cathode 75. The shield 76 is fixed by way of an insulator 77 to the vacuum chamber wall 71.

The shield 76 is set such that the height of its upper edge 76a is identical with the height of the evaporation surface 751 before operation, for the reason to be described below. That is, if the upper edge 76a of the shield 76 is higher than the evaporation surface 751, evaporated metal is deposited on the shield 76 to fill the gap G, thereby causing transfer of the arc spot to the shield 76. On the other hand, if the upper edge 76a is lower than the evaporation surface 751, the arc spot may be formed at a portion not surrounded by the shield 76, to cause evaporation of the cathode metal in this portion and, as a result, the gap G is short-circuited to again transfer the arc spot to the shield 76.

As described above, it is necessary to keep the height identical between the upper edge of the shield and the evaporation surface of the cathode in order to stably maintain the arc discharge. However, as shown in FIG. 10 which illustrates the state of the cathode consumption when the operation is conducted for a long period of time, the evaporation surface 751 of the cathode 75 is consumed and retracted concavely into a configuration having a bottom and a wall, in which the upper surface 751a at the wall of the evaporation surface 751 is lower by a distance B shown in FIG. 10 than the upper edge 76a of the shield 76. Therefore, the evaporated cathode metal il deposited on the inner surface near the upper edge 76a of the shield 76 to fill the gap G, so that the shield 76 and the cathode 75 are short-circuited, and so that the arc spot transfers to the shield 76. Then, when the arc spot transfers to the shield 76, the cathode substance that fills the gap G is melted and evaporated by the arc to open the short-circuit between the shield 76 and the cathode 75, so that temporary arc interruption (stop of arc discharge) intermittently occurs frequently, making the arc discharge instable.

When arc disconnection occurs, a trigger electrode is actuated instantly to start the arc discharge again.

SUMMARY OF THE INVENTION

It is, accordingly, an object of the present invention to provide a cathodic arc deposition system capable of maintaining stable arc discharge even when an evaporation surface of a cathode is lowered in the course of long time operation, and capable of using the cathode for its full life, thereby improving cathode utilization efficiency.

The present invention provides, as a preferred embodiment, a cathodic arc deposition system comprising, in a vacuum chamber, a cathode made of a film-forming material and a shield surrounding the circumferential side of the cathode with a gap therebetween and, in addition, means for adjusting the height of an upper edge of the shield to be identical with that of an evaporation surface of the cathode, in which the film-forming material is evaporated by generating arc discharge between the cathode and an anode, is ionized from an evaporation surface of the cathode and is deposited onto the surface of a substrate disposed in the vacuum chamber.

In this cathodic arc deposition system, even when the cathode is consumed and the evaporation surface thereof is retracted due to long time operation, the shield and the evaporation surface can be adjusted in height by an adjusting means.

This can prevent the transfer of the arc spot from the evaporation surface, maintain stable arc discharge without causing arc disconnection and permit use of the cathode for its full life without replacing a still usable cathode with a new one, thereby improving cathode utilization efficiency.

Further, another preferred embodiment of the present invention comprises a shield that covers a circumferential edge of the evaporation surface of a cathode from above with a gap therebetween.

In this cathodic arc deposition system, the circumferential edge of the evaporation surface of the cathode, in addition to the circumferential side of the cathode, is covered by the shield with a gap. In this embodiment, the arc spot is not formed on the circumferential edge of the evaporation surface of the cathode and the latter is not consumed.

In this embodiment having such a constitution, since the circumferential edge of the evaporation surface of the cathode is not formed with the arc spot and thus is not consumed, even when the evaporation surface formed at an inside of the circumferential edge of the evaporation surface is retracted due to long time operation, a positional relationship between the shield and the circumferential edge can be maintained constant, thereby enabling one to maintain stable arc discharge, as well as to use the cathode for its full life.

Further, another preferred embodiment of the present invention comprises a control device for controlling the adjusting means that adjusts an upper edge of a shield and an evaporation surface of a cathode to an identical height. Accordingly, even when the cathode is consumed and the evaporation surface is retracted due to long time operation, since the difference of the height between the upper edge of the shield and the evaporation surface of the cathode which may cause arc stop is automatically adjusted to decrease the difference, stable arc discharge can be maintained without causing frequent arc stop.

This can overcome the lowering of productivity and degradation of the quality of the substrate caused by frequent arc stop, as well as permitting use of the cathode for its full life without replacing a still usable cathode with new one, thereby improving the utilizing efficiency of the cathode. Further, there is no more need for an operator to monitor the arc discharge state, and a continuous operation with no operator's aid can be attained.

BRIEF ION OF THE ACCOMPANYING DRAWINGS

These and other objects, as well as advantageous features of the present invention, will become apparent by reading the description of the preferred embodiments according to the present invention with reference to the drawings, wherein FIG. 1 is an explanatory view illustrating the outline for the entire cathodic arc deposition system according to a first embodiment of the present invention;

DESCRIPTION OF THE PREFERRED EMBODIMENTS

The present invention will now be described by way of its preferred embodiments.

Figure 1:
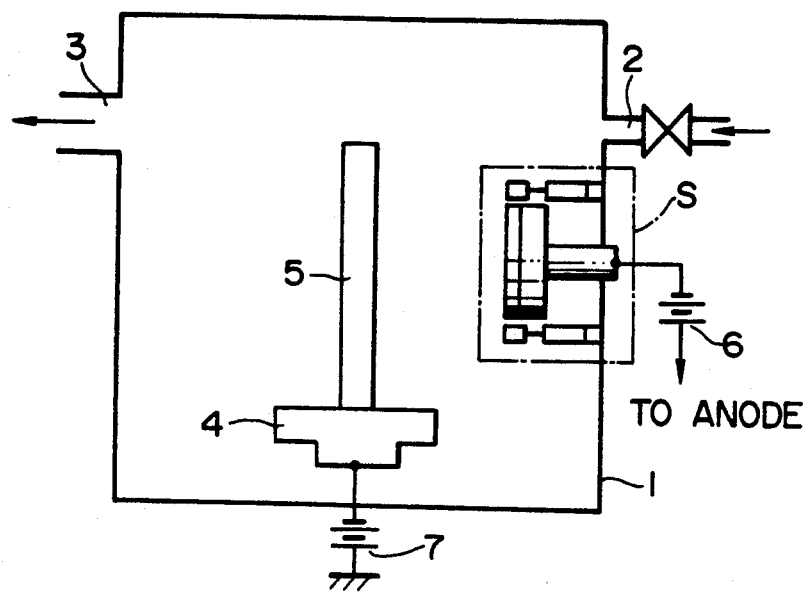
Figure 2:
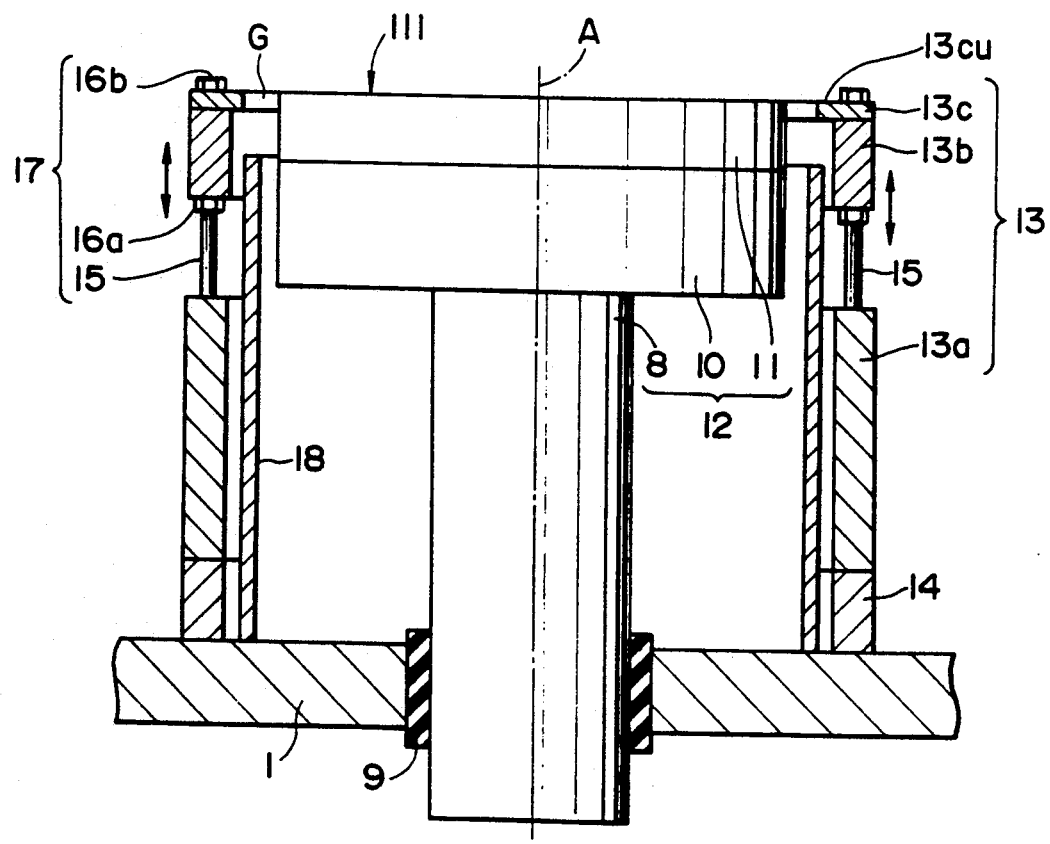
FIG. 2 is a cross sectional explanatory view of the constitution of an arc evaporation source in the cathodic arc deposition system shown in FIG. 1.
Figure 3:
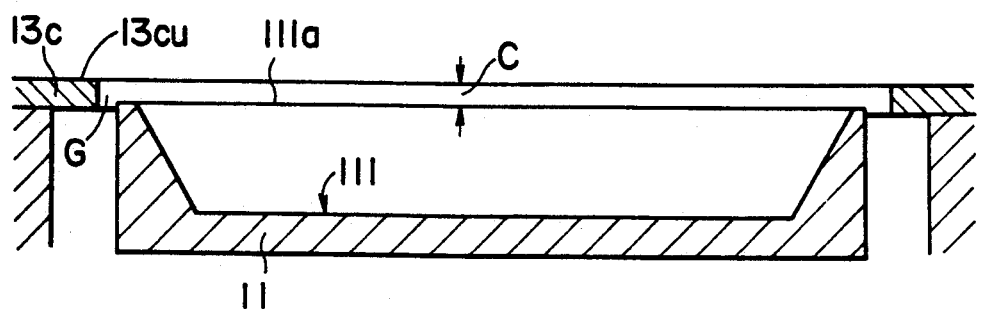
FIG. 3 is a view illustrating the state of consumption of the cathode shown in FIG. 2.

FIG. 1 is an explanatory view illustrating the outline for an entire cathodic arc deposition system as a first embodiment according to the present invention, FIG. 2 is an explanatory cross sectional view of the constitution of an arc evaporation source in the cathodic arc deposition system shown in FIG. 1 and FIG. 3 is a view illustrating the state of consumption of the cathode shown in FIG. 2.

In FIG. 1, a vacuum chamber 1 has a gas introduction port 2 that introduces an argon gas for maintaining arc discharge, and an exhaust port 3 for evacuating the inside by a vacuum pump (not illustrated). In this embodiment, an arc evaporation source S to be described later comprises, for example, a cathode provided with a shield for preventing arc spot transfer attached to the side wall of the vacuum chamber 1. A rotational table 4 is disposed in the vacuum chamber 1, and a substrate 5 (specimen substrate) is placed on the rotational table 4 such that it opposes an evaporation surface of the cathode, to be described later, of the arc evaporation source S. An arc power source 6 is disposed for applying an arc discharge voltage between the cathode of the arc evaporation source S and an anode (not illustrated) disposed in the vacuum chamber 1 with such a polarity as to render the cathode negative, and a bias power supply 7 is disposed for applying a negative bias voltage to the substrate 5.

Description will now be made of the constitution of the arc evaporation source S. As shown in FIG. 2, a cylindrical conductor 8 having an axial line A is attached by way of a ceramic insulator 9 to the wall of the vacuum chamber 1 with the upper surface being protruded inside of the vacuum chamber 1. An electroconductive cooling plate 10 which is cooled internally is fixed to the upper surface of the conductor 8 and applied with the negative voltage from the arc power source 6. A disc-shaped cathode 11 made of a film-forming material and having an evaporation surface 111 formed on the upper surface thereof is fixed to the upper surface of the cooling plate 10. The cooling plate 10 and the cathode 11 are disposed on the conductor 8, with their respective axial lines (center lines) being aligned with the axial line A. The conductor 8, the cooling plate 10 and the cathode 11 constitute a cathode portion 12.

Further, a cylindrical lower shield 13a is fixed by way of an insulator 14 to the vacuum chamber 1 with the axial line being aligned with the axial line A of the cathode 11. Stud bolts 15 are embedded, at the upper edge (upper circumferential edge) of the lower shield 13a at positions circumferentially divided equally into six parts, with the threaded portion being protruded upward. The bolts 15 are inserted into a cylindrical upper shield 13b having an axial line A identical with that of the cathode 11, and having the same inner and outer diameters as those of the lower shield 13a and provided with bolt penetration holes, for surrounding the circumferential side of the cathode 11 and a thin annular upper end shield 13c having an inner diameter smaller than that for the upper shield 13b and also provided with bolt penetration holes, successively, with lower nuts 16a for adjusting the height being fit at a predetermined distance from the upper edge of the lower shield 13a as shown in the FIGURE. Then, both of the shields 13b and 13c are secured by clamping upper nuts 16b for adjusting the height in such a state that the upper edge 13cu of the upper end shield 13c is opposed with a gap G to the circumferential side of the cathode 11, at a height identical with the evaporation surface 111 of the cathode ii.

In the first embodiment, the shield 13 is constituted by the lower shield 13a, the upper shield 13b and the upper end shield 13c (upper shield). The stud bolts 15 and the nuts 16a, 16b for adjusting the height constitute a shield moving mechanism 17 for advancing and retracting the upper shield 13b and the upper end shield 13c along the direction of the central axial line A, so that the height of the upper edge 13cu of the upper end shield 13c is identical with the height of the evaporation surface 111 of the cathode 11. Further, a cylindrical shielding plate 18 is disposed between the cathode portion 12 and the shield 13 and secured to the wall of the vacuum chamber 1. The shielding plate 18 is used for shielding the stud bolts 15 from the cathode portion 12. The arc evaporation source s is constituted by the cathode portion 12, the shield 13, the shield moving mechanism 17 and the shield plate 18. The shield 13 is made of steel. A trigger electrode for starting an arc is not illustrated.

Description will now be made of the operation of the cathodic arc deposition system according to the first embodiment with reference to FIG. 1 through FIG. 3.

Before starting the operation of the system, the height of the upper edge 13cu of the upper end shield 13c is adjusted by the shield moving mechanism 17 such that the height thereof is identical with the height of the evaporation surface 111 of the cathode 11. In this case, the gap G between the upper end shield 13c and the circumferential side of the cathode 11 is set to about 0.5 mm as a value at which arc discharge can be conducted most stably as a result of an experiment conducted under usual operation conditions of supplying an arc current of about 100 A. The thickness of the upper shield 13c is about 2 Mm.

In this way, operation is started after setting the height of the upper edge 13cu of the upper end shield 13c identical with the height of the evaporation surface 111 of the cathode 11. Arc discharge is generated between the cathode 11 and the anode in the vacuum chamber 1, by which the film-forming material is evaporated from the evaporation surface 111 of the cathode 11 and ionized simultaneously to deposit the ionized film-forming material on the surface of the substrate 5.

When the system is operated for a long period of time, since the cathode 11 is consumed, the evaporation surface 111 is retracted concavely into a shape having a bottom and a wall, in which a difference C of the height is caused between the upper edge 13cu of the upper end shield 13c and the wall upper surface 111a of the evaporation surface 111 as shown in FIG. 3. Then, if the operation is continued further in this state, temporary arc interruption occurs frequently to make the arc discharge unstable, as described previously.

In view of the above, when the difference C of the height exceeds a predetermined value, for example, 0.5 Mm, the height adjusting nuts 16a, 16b are loosened, and the upper shield 13b and the upper end shield 13c are retracted downward until the height difference C described above is eliminated and, subsequently, the height adjusting nuts 16a, 16b are clamped. In this way, height is adjusted such that the height of the upper edge 13cu of the upper end shield 13c is identical with the height of the upper surface 111a of the wall of the evaporation surface 111. Afterward, adjustment of the height described above is repeated every time the height different C between the upper surface 111a of the wall of the evaporation surface 111 and the upper edge 13cu of the upper end shield 13c exceeds a predetermined value.

This enables one to maintain stable arc discharge without causing arc disconnection, as well as use of the cathode 11 for its full life without exchanging the cathode 11 as in the prior art. various design changes are possible for the shield moving mechanism 17 so long as the shield can be moved in the axial direction such that the height of the upper edge of the shield is made identical with the evaporation surface of the cathode.

Description will now be made of another preferred embodiment of the present invention.

Figure 4:
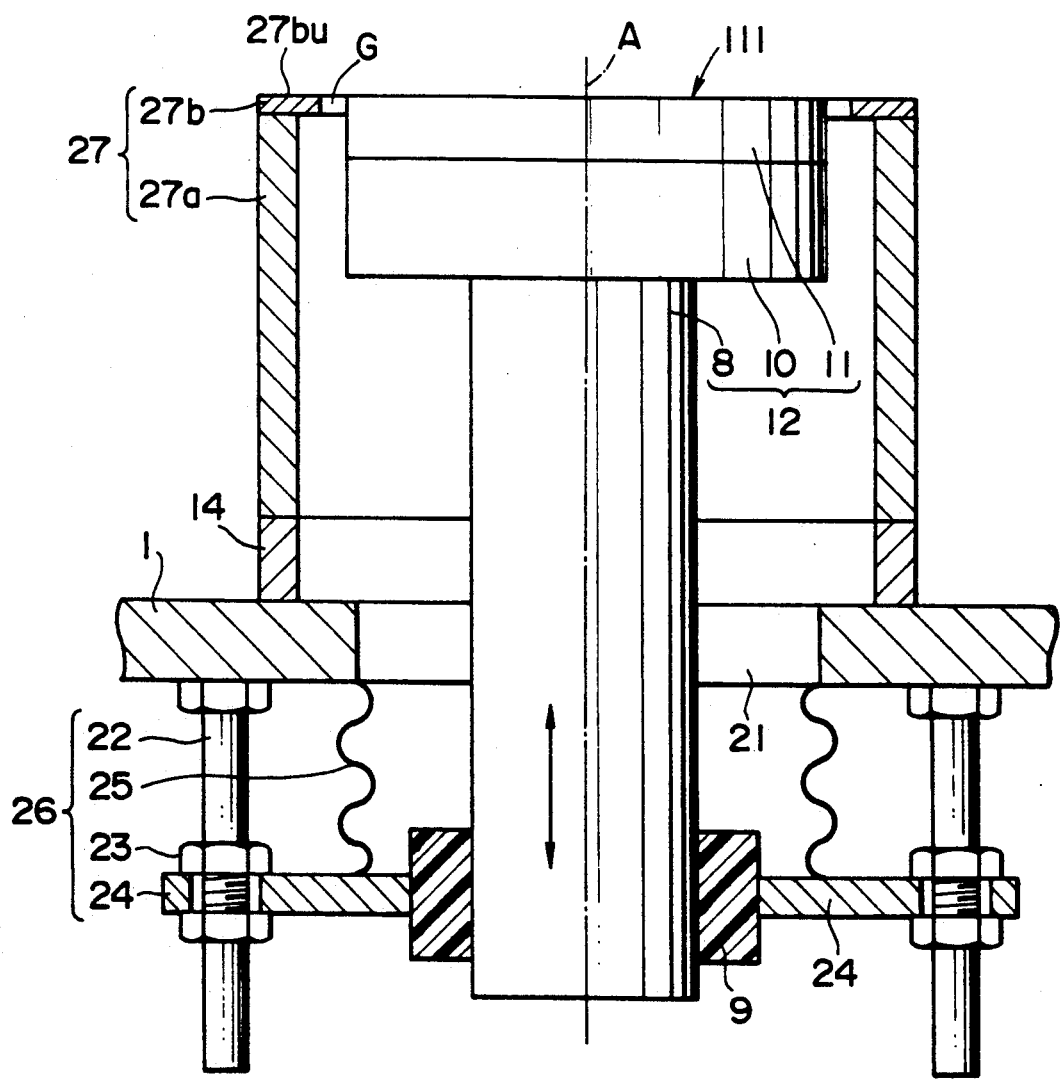
FIG. 4 is an explanatory cross sectional view of the constitution of an arc evaporation source in a cathodic arc deposition system according to a second embodiment of the present invention.

FIG. 4 is an explanatory cross sectional view of the constitution of an arc evaporation source according to a second embodiment of the present invention.

Since the constitution of the second embodiment is identical with that of the first embodiment except for the difference in the constitution of the arc evaporation source, description will be made only of the arc evaporation source, while indicating portions substantially in common with the first embodiment with identical reference numerals.

In FIG. 4, a penetration hole 21 is formed in the wall of vacuum chamber 1 and a plurality of stud bolts 22 are threaded to the circumferential wall surface of the vacuum chamber 1, each at a position equally spaced from the axial line of the penetration hole 21, with each of their threaded portions protruding downwardly as shown in the drawing.

A cathode support plate 24 is supported and fixed by clamping each of the nuts 23 for adjusting height, screw-coupled with the threaded portion of each of the stud bolts 22 at a predetermined position in the longitudinal direction thereof. A cylindrical conductor 8 having an axial line A is supported and secured by way of a ceramic insulator 9 to the cathode support plate 24, with the upper surface thereof protruding from the penetration hole 21 to the inside of the vacuum chamber 1.

An electroconductive cooling plate 10, cooled internally is fixed to the upper surface of the conductor 8. A disc-shaped cathode 11 made of a film-forming material and having an evaporation surface 111 formed on the upper surface thereof is fixed to the upper surface of the cooling plate 10. The cooling plate 10 and the cathode 11 are disposed on the conductor 8 such that their respective axial lines (center lines) are aligned with the axial line A. The conductor 8, the cooling plate 10 and the cathode 11 constitute a cathode portion 12.

Bellows 25 are connected at one end to the circumferential periphery of the penetration hole 21 of the vacuum chamber 1 and connected at the other end to the cathode support plate 23 so as to surround the conductor 8, so that the inside of the vacuum chamber 1 is kept airtight by the bellows 25. In this embodiment, the stud bolts 22, the height adjusting nuts 23, the cathode support plate 24 and the bellows 25 constitute a cathode moving mechanism 26 for moving the cathode 11 in the direction of the axial line A thereof.

A cylindrical shield 27a that surrounds the circumferential side of the cathode 11, with the axial line thereof being aligned with the axial line A of the cathode 11, is secured by way of an insulator 14 to the vacuum chamber 1. A thin annular upper end shield 27b having an inner diameter smaller than that of the circumferential surface side shield 27a is secured on the circumferential side shield 27a, and the circumferential side shield 27a and the upper end shield 27b constitute a shield 27. The cathode portion 12, the shield 27 and the cathode moving mechanism 26 constitute an arc evaporation source S.

Description will now be made of the operation of the cathodic arc deposition system having the foregoing constitution with reference to FIG. 4.

Before starting the operation of the system, the height of the upper edge 27bu of the upper end shield 27b is adjusted by the cathode moving mechanism 26 such that the height is identical with that of the evaporation surface 111 of the cathode 11. Then, when the system is operated for a long period of time, since the cathode 11 is consumed, the evaporation surface 111 retracts concavely into a shape having a bottom and a wall, in which the upper surface of the wall becomes lower than the upper edge 28bu of the upper end shield 27b, to cause a difference of the height between the upper edge 27bu and the upper surface of the wall of the evaporation surface 111 (refer to FIG. 3). Then, if the operation is further continued in this state, temporary arc interruption occurs frequently to make the arc discharge unstable, as described previously.

In view of the above, when the difference of the height exceeds a predetermined value, for example, 0.5 Mm, the height adjusting nuts 23 are loosened, the cathode support plate 24 attached to the cathode portion 12 is advanced upward in the FIGURE and, subsequently, the height adjusting nuts 23 are clamped again, to thereby adjust the height such that the height of the upper edge 27bu of the upper end shield 27b is identical with the height of the upper surface of the wall of the evaporation surface 111. Afterward, the height adjustment described above is repeated every time the height difference between the upper surface of the wall of the evaporation surface 111 and the upper edge 27bu of the upper end shield 27b exceeds the predetermined value.

This enables one to maintain stable arc discharge without causing arc disconnection and to use the cathode 11 for its full life without replacing the cathode 11 as in the prior art.

Various design changes are possible for the cathode moving mechanism 26, so long as the cathode can be moved in the axial direction such that the height is identical between the evaporation surface of the cathode and the upper edge of the shield.

Description will now be made of a further preferred embodiment according to the present invention.

Figure 5:
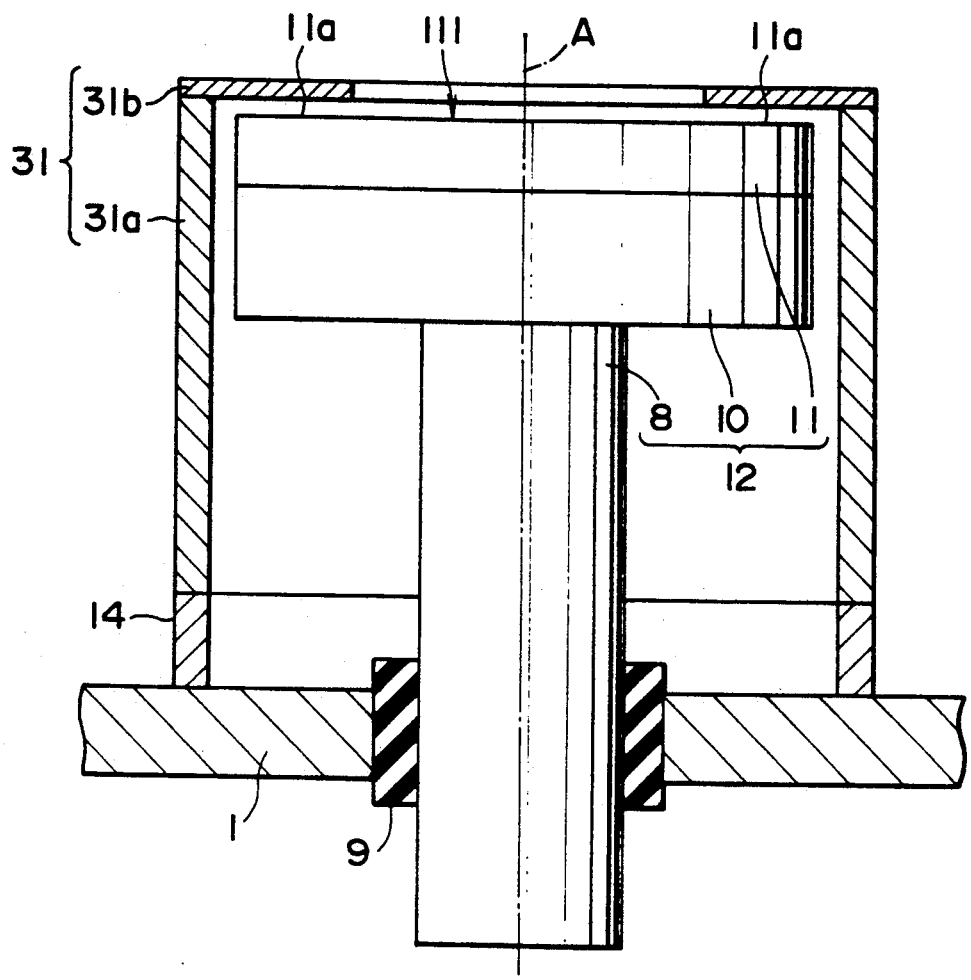
FIG. 5 is an explanatory cross sectional view of the constitution of an arc evaporation source in a cathodic arc deposition system according to a third embodiment of the present invention.

FIG. 5 is an explanatory cross sectional view of an arc evaporation source according to a third embodiment of the present invention.

Since the constitution of the third embodiment is identical with that of the first embodiment except for the difference of the constitution of the arc evaporation source, description will be made only of the arc evaporation source while indicating those portions substantially in common with the first embodiment with identical reference numerals.

As shown in FIG. 5, a circumferential side shield 31a is secured by way of an insulator 14 to a vacuum chamber 1 so as to surround the circumferential surface of the cathode 11 with the axial line thereof being aligned with the axial line A of the cathode ii. An annular edge shield 31b is attached to the circumferential side shield 31a. The edge shield 31b protrudes inward from the upper edge of the side circumferential shield 31a and covers the circumferential edge 11a of the evaporation surface of the cathode 11 with a predetermined gap D. The side circumferential shield 31a and the edge shield 31b constitute a shield 31. In this embodiment, a cathode portion 12 comprising a conductor 8, a cooling plate 10 and the cathode 11, and the shield 31 constitute an arc evaporation source S.

The distance D between the circumferential edge 11a of the evaporation surface of the cathode 11 and the edge shield 31b is set to about 0.5 mm as a value at which arc discharge can be conducted most stably as a result of an experiment conducted under usual operation conditions of supplying an arc current of about 100 A. Further, the thickness of the edge shield 31b is appropriately about 2 mm.

Figure 6:
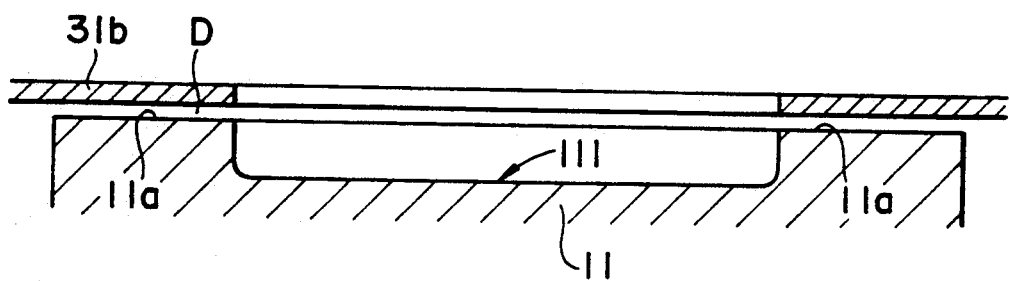
FIG. 6 is a view illustrating the state of consumption of the cathode shown in FIG. 5.

Description will now be made of the operation of the cathodic arc deposition system of the third embodiment with reference to FIG. 6 which illustrates the state of consumption of the cathode.

When the system is operated, since the circumferential side of the cathode 11 and the circumferential edge 11a of the evaporation surface thereof are covered by the shield 31 with a gap, no arc spot is formed on the circumferential edge 11a of the evaporation surface but the portion inward of the circumferential edge 11a of the evaporation surface constitutes the evaporation surface 111. As shown in FIG. 5, this enables one to maintain a constant positional relationship between the edge shield 31b and the circumferential edge 11a of the evaporation surface of the cathode 11 even when the evaporation surface 111 is retracted due to the long time operation, so that stable arc discharge can be maintained for the full life of the cathode 11 without conducting height adjustment between the evaporation surface 111 and the shield edge 31b.

Description will now be made of a still further preferred embodiment according to the present invention.

Figure 7:
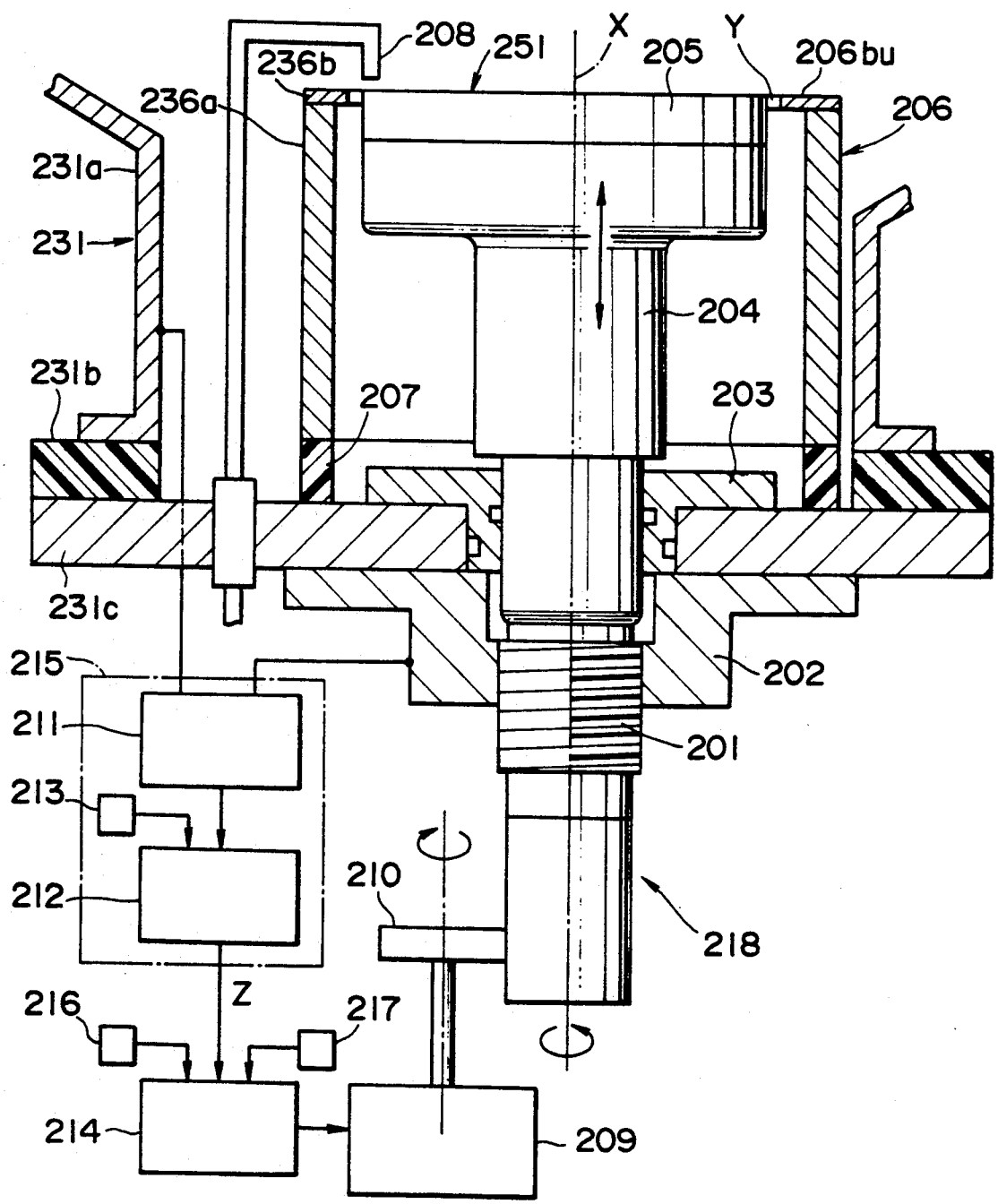
FIG. 7 is an explanatory cross sectional view of the constitution of an arc evaporation source in a cathodic arc deposition system according to a fourth embodiment of the present invention.

FIG. 7 is an explanatory view of the constitution of an arc evaporation source according to a fourth embodiment of the present invention.

In FIG. 7, a vacuum chamber 231 comprises a chamber main body 231a and a circumferential chamber side member 231c fixed by way of an insulation flange 231b to the chamber main body 231a to define an airtight chamber, so that the inside can be evacuated. As shown in the drawing, a chamber penetration hole is formed in the circumferential chamber side member 231c such that a rotational advancing/retracting shaft 201 can enter into and retract from the vacuum chamber 231, and an electroconductive annular support plate 202 having a penetration hole formed with female threads is fixed to the circumferential chamber side member 231c at the outer surface at the position of the chamber penetration hole.

The rotational advancing/retracting shaft 201 has electroconductivity, is in a cylindrical shape, and has male threads formed at a portion of the outer circumferential surface thereof for screw-coupling with the female threads of the penetration hole in the support plate 202. The shaft 201 is supported with the male threads being screw-coupled with the female threads of the penetration hole in the support plate 202 and disposed with the top end of the shaft being protruded into the vacuum chamber 231. A seal member 203 is disposed between the rotational advancing/retracting shaft 201 and the circumferential chamber side member 231c, such that air-tightness in the vacuum chamber 231 can be kept even when the rotational advancing/retracting shaft 201 enters into and retracts from the vacuum chamber 231.

An electroconductive cathode support conductor 204 is fixed at the top end of the rotational advancing/retracting shaft 201 connected with a negative terminal of a DC arc power supply, with the axial line thereof being aligned with the axial line X of the rotating advancing/retracting shaft 201. A disc-shaped cathode 205 made of a film-forming metal material and having an evaporation surface 251 at the upper surface thereof is placed on the cathode support conductor 204 with the axial line thereof being aligned with the axial line X.

Then, a cylindrical circumferential side shield 206a is secured by way of an insulator 207 to the circumferential chamber side member 231 for surrounding the circumferential side of the cathode 205 and the cathode support conductor 204, with the axial line thereof being aligned with axial line X of the cathode 205. An annular upper end shield 206b protruded inwardly from the upper circumferential edge is secured to the upper circumferential edge of the side circumferential shield 206a so as to surround the circumferential side of the cathode 205 with a gap Y of about 0.5 mm, and the side circumferential shield 206a and the upper end shield 206b constitute a shield 206.

A trigger 208 is for starting arc is insulatively attached to the circumferential chamber side member 231c and connected to an arc start circuit of a DC arc power supply (not illustrated).

A motor 209 for advancing and retracting the cathode is attached to a fixing bed disposed at the outside of the vacuum chamber 231, and a gear 210 is attached to a speed retarder shaft of the motor 209 and applied with insulation relative to the motor 209.

When the gear 210 is rotated by the motor 209 for advancing/retracting the cathode, the rotational advancing and retracting shaft 201 is rotated, and the cathode 205 is advanced or retracted vertically while rotating at a low speed.

An arc stop voltage detection circuit 211 is inputted with a voltage between the chamber main body 231a and the support plate 202, which detects an abrupt increase of the voltage to about 60 V, as compared with the voltage of about 18 V during arc discharge, when the arc discharge is stopped during deposition operation and outputs an arc stop pulse indicating this to a counter 212.

The counter 212, in this embodiment, counts the number of arc stops per hour after starting the deposition and, when the counted value reaches a predetermined number N previously set by an arc stop number setter 213, gives a cathode evaporation surface retraction detection signal Z to a motor control circuit 214.

The arc stop voltage detection circuit 211, the counter 212 and the arc stop number setter 213 constitute an arc stop number detection device 215.

The motor control circuit 214 is used for the driving control of the cathode advancing/retracting motor 209 to advance or retract the cathode 205 by way of the rotational advancing/retracting shaft 201 along the vertical direction in the FIGURE. When the cathode evaporation surface retraction detection signal Z is given from the arc stop number detection circuit 215, the motor control circuit 214 controls the cathode advancing/retracting motor 209 so as to advance the cathode 205 by a previously set advancing distance d via an advancing distance setter 216. Numeral 217 denotes a device for driving the cathode advancing/retracting motor 209 by manual operation.

The rotational advancing/retracting shaft 201, the support plate 202, the seal member 203, the cathode support conductor 204, the cathode advancing and retracting motor 209, the gear 210, the motor control circuit 214, the advancing direction setter 216 and the manual operation device 217 constitute a cathode moving mechanism 218 as the moving mechanism.

Figure 8:
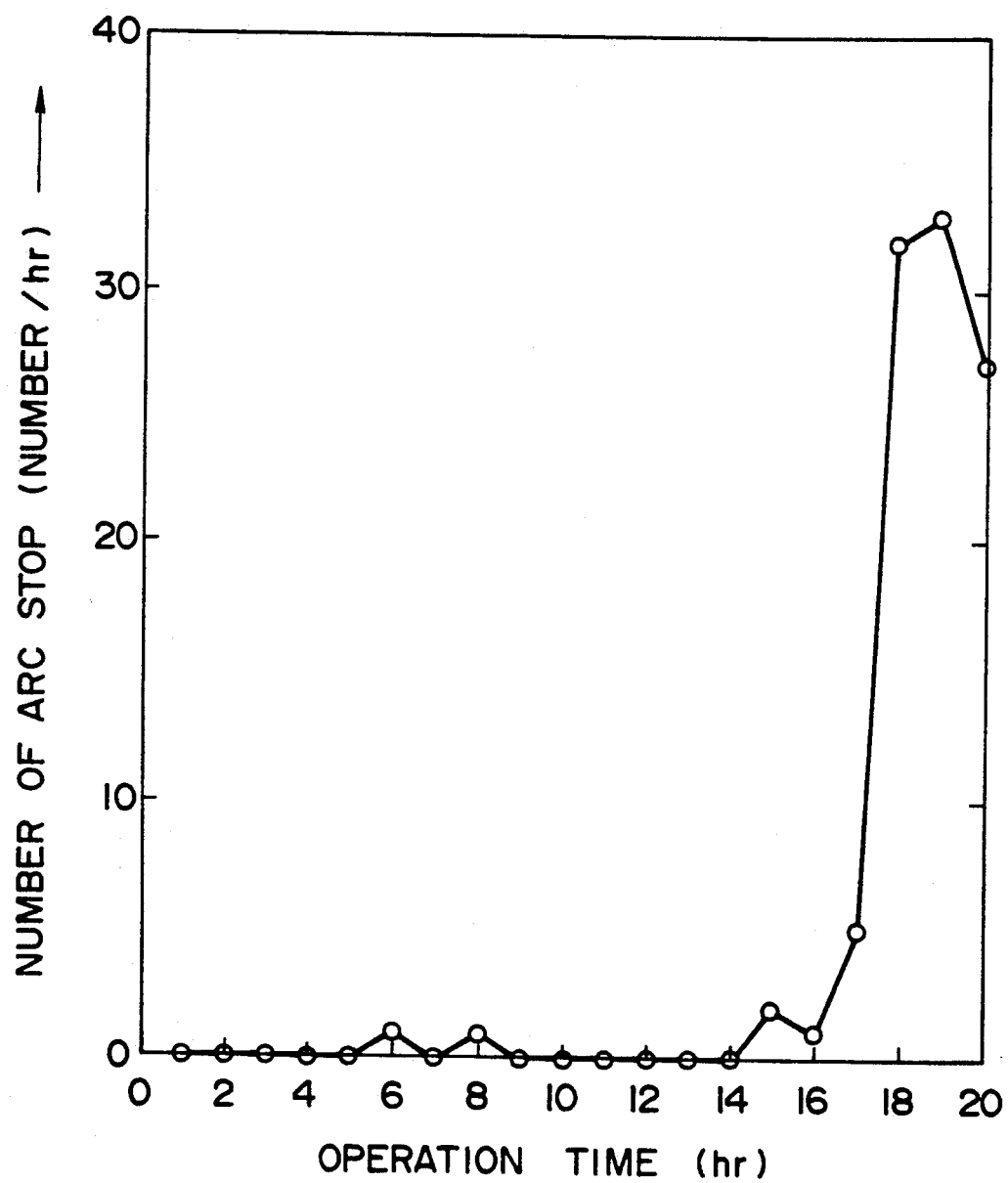
FIG. 8 is a graph illustrating an example of a relationship between an operation time after starting vapor deposition and the number of arc stops per 1 hour in the cathodic arc disposition system shown in FIG. 7.
Figure 9:
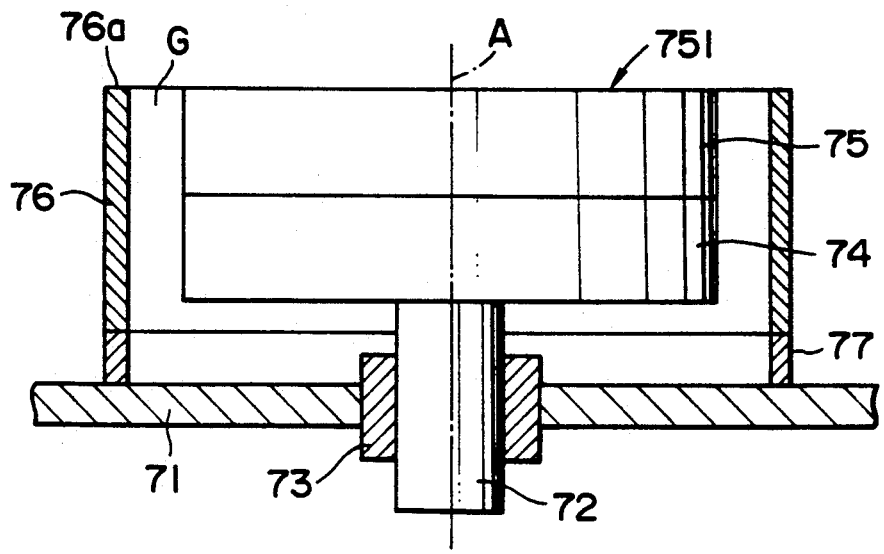
FIG. 9 is a cross sectional explanatory view of an arc evaporation source in a cathodic arc metal deposition system in the prior art.
Figure 10:
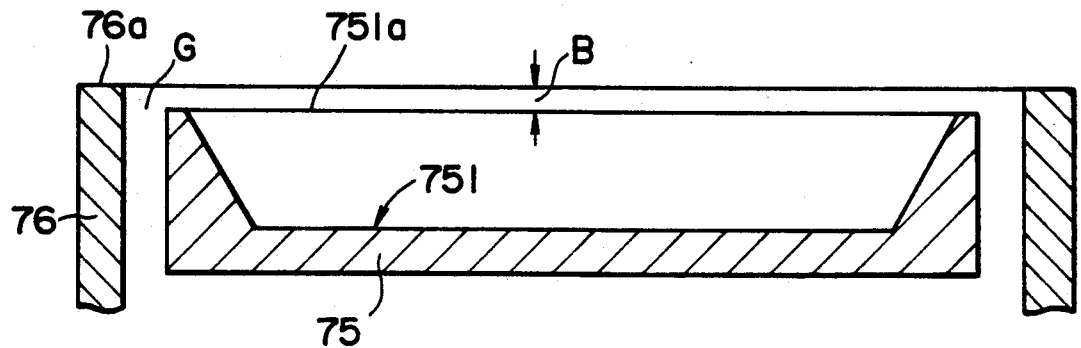
FIG. 10 is a view illustrating the state of consumption of the cathode shown in FIG. 9 in the prior art.

FIG. 8 is a graph illustrating an example of a relationship between operation time after starting the vapor deposition by the cathodic arc deposition system and a number of arc stops per hour under standard conditions of an arc current of 100 A by using a cathode made of Ti. The graph shows that the number of arc stops (number/hour) during a period from 18 hours to 19 hours after starting the deposition is increased to greater than 30 as compared with the preceding period. In this case, the difference B of the height between the upper surface of the wall in the evaporation surface of the cathode and the upper edge of the shield (refer to FIG. 10) is about 0.5 to 1 Mm.

Further, FIG. 8 shows that there is a tendency in a period from 16 hours to 17 hours of system operation time, before the extreme increase of the number of arc stops, in which the number of arc stops is increased to 5-10 as compared to before.

The invention according to the fourth embodiment utilizes the foregoing. In the arc evaporation source device of the cathodic arc deposition system according to the present invention, when deposition is started, a predetermined number of temporary arc stops per hour is detected by the arc stop detection device and the cathode evaporation surface retraction detection signal is given to the moving mechanism when the detected number of arc stops reaches a predetermined number. When the moving mechanism is operated upon receiving the signal, either the cathode or the shield is moved by a predetermined distance in the direction of decreasing the difference in height between the evaporation surface of the cathode and the upper edge of the shield in the direction of the axial line. This decreases the difference in height between the upper edge of the shield and the retracted evaporation surface of the cathode to prevent frequent arc stops. In FIG. 8, reference is made to an example in which the number of arc stops is increased in a period from 16 hours to 17 hours after starting the operation as compared with before. A similar tendency is shown also in other cases although the time until such a tendency appears differs depending on the conditions such as the substance of the cathode and the arc current.

Description will now be made of the operation of the cathodic arc deposition system having the arc evaporation source device of the foregoing constitution with reference to FIGS. 7 and 8. At first, prior to starting the operation of the system, the cathode advancing/retracting motor 209 is driven to position the upper surface as the evaporation surface 251 of the cathode 205 at a height identical with that of the upper edge 206bu of the shield 206. Further, in the fourth embodiment, the arc stop number N set by the arc stop number setter 213 is set at N=10 and the advancing direction d set by the advancing direction setter 216 is set at d=0.1 mm. Then, the operation is started to generate arc discharge, and the film-forming material is evaporated from the evaporation surface 251 of the cathode 205 and ionized at the same time to deposit the ionized cathode substance on the surface of a substrate.

When the operation is started and the evaporation surface 251 of the cathode 205 is consumed and retracted concavely along with elapse of the operation time and the height of the upper surface of the wall of the evaporation surface 251 is lower than the upper edge 206bu of the shield 206, the number of arc stops is increased. Then, when the number of arc stops per hour reaches the set number of arc stops: N=10, the cathode evaporation surface retraction detection signal Z is inputted from the counter 212 to the motor control circuit 214.

This drives the cathode advancing/retracting motor 209 and the cathode 205 is advanced, by d=0.1 Mm in this embodiment, and the difference of the height between the upper edge 206bu of the shield and the upper surface of the wall of the evaporation surface 251 is decreased. As a result of repeating such control during operation of the system, even if the evaporation surface 251 of the cathode 205 is retracted due to long time operation, since automatic control is applied such that the difference of the height between the upper edge 206bu of the shield and the upper surface of the wall in the cathode evaporation surface 251 is reduced before occurrence of frequent arc stops, for example more than 30 times per hour, stable arc discharge is maintained without causing frequent arc stops up to the life of the cathode 205. Further, the monitoring operation of the state of arc discharge by an operator is necessary and an arc ion plating system having the arc evaporation source device according to the present invention can attain continuous operation with no operator's aid.

Referring to the moving mechanism, although the cathode moving mechanism 218 is exemplified in this embodiment in which the cathode 205 is advanced so as to decrease the difference of the height between the upper edge 206bu of the shield and the upper surface of the wall in the cathode evaporation surface 251 based on the cathode evaporation surface retraction detection signal Z, it may be of course be adapted such that the shield 206 is retracted in the axial direction, or both the cathode 205 and the shield 206 are moved so as to reduce the difference in height between both of them, based on the cathode evaporation surface retraction detection signal Z.

The present invention can be practiced in various other forms without departing the spirit and the principal feature thereof. Therefore, the foregoing embodiments are merely examples in all of respects and should not be construed limitatively. The scope of the present invention is shown by the claims and not restricted at all by the text of the specification. Further, all modifications and changes pertinent to the equivalence range of the claims are within the scope of the present invention.

We claim:

1. A cathodic arc deposition system comprising:
   a cathode comprising a film-forming material,
   a shield surrounding a circumferential side of said cathode with a gap therebetween,
   a vacuum chamber having said cathode and said shield inside of the vacuum chamber,
   means for mounting a substrate to have deposited at a surface thereof an ionized film-forming material by generating an arc discharge between said cathode and an anode associated with said vacuum chamber, thereby evaporating said film-forming material from an evaporation surface of said cathode and ionizing the same, and
   an adjusting means for adjusting an upper edge of said shield and the evaporation surface of said cathode to be at substantially an identical height, wherein the adjusting means comprises means for moving the shield and said adjusting means is shielded by a shield plate for shielding from the ionized film-forming material.

2. A cathodic arc deposition system as defined in claim 1, wherein the adjusting means for moving the shield comprises stud bolts, an upper shield disposed on said stud bolts and height adjusting nuts between which said shield is mounted.

3. A cathodic arc deposition system as defined in claim 1, including an arc voltage detection circuit which controls the adjusting means in response to detection of an arc stop during a deposition operation.

4. A cathodic arc deposition system as defined in claim 3, wherein the system further comprises a counter for counting the number of arc stops detected by the arc voltage detection circuit and an arc stop number setter for presetting the number of arc stops, wherein the adjusting means is actuated so that the height of the upper edge of the shield is identical with the height of the evaporation surface of the cathode when the detected number of arc stops reaches a predetermined number of arc stops.

5. A cathodic arc deposition system comprising:
   a cathode comprising a film-forming material,
   a shield surrounding a circumferential side of said cathode with a gap therebetween,
   a vacuum chamber having said cathode and said shield inside of the vacuum chamber,
   a vacuum chamber having said cathode and said shield inside of the vacuum chamber,
   means for mounting a substrate to have deposited at a surface thereof an ionized film-forming material by generating an arc discharge between said cathode and an anode associated with said vacuum chamber, thereby evaporating said film-forming material from an evaporation surface of said cathode and ionizing the same, and
   an adjusting means for adjusting an upper edge of said shield and the evaporation surface of said cathode to be at substantially an identical height, wherein the adjusting means moves the cathode.

6. A cathodic arc deposition system as defined in claim 5, wherein the adjusting means for moving the cathode comprises a cathode support plate attached to a conductor disposed below the cathode, height adjusting nuts between which the cathode support plate is mounted and stud bolts to which said height adjusting nuts are screw-coupled.

7. A cathodic arc deposition system as defined in claim 6, including bellows provided between the cathode support plate and the vacuum chamber.

8. A cathodic arc deposition system as defined in claim 5, wherein the adjusting means for moving the cathode comprises a rotational advancing/retracting shaft disposed below the cathode and an annular support plate screw-coupled with the rotational advancing/retracting shaft and secured to the vacuum chamber, wherein rotation of said rotational advancing/retracting shaft relative to said support plate adjusts said cathode.

9. A cathodic arc deposition system comprising a cathode disposed in a vacuum chamber and comprising a film-forming material and a shield surrounding the circumferential side of the cathode with a gap therebetween, said shield having an axial line aligned with an axial line of said cathode and having an upper edge disposed at a side of the evaporation surface of said cathode, wherein arc discharge is generated between said cathode and an anode disposed in the vacuum chamber, thereby evaporating the film-forming material from the evaporation surface of said cathode and ionizing the same, and depositing the ionized film-forming substance on the surface of a substrate disposed in the vacuum chamber, and cathode moving means for moving said cathode in the axial direction thereof relative to said shield.

10. A cathodic arc deposition system comprising:
a cathode comprising a film-forming material,
a shield surrounding a circumferential side of said cathode with a gap therebetween and further surrounding a circumferential edge of an evaporation surface of said cathode with a gap therebetween,
a vacuum chamber having said cathode and said shield therein, and
means for mounting a substrate to have an ionized film-forming material deposited on a surface thereof by generating an arc discharge between said cathode and an anode disposed in said vacuum chamber, thereby evaporating said film-forming material from an evaporation surface of said cathode and ionizing the same.

11. A cathodic arc deposition system comprising a cathode disposed in a vacuum chamber and comprising a film-forming material and a shield surrounding the circumferential side of the cathode with a gap therebetween, said shield having an axial line aligned with an axial line of said cathode and having an upper edge disposed on the side of the evaporation surface of said cathode, wherein arc discharge is generated between said cathode and an anode disposed in the vacuum chamber, thereby evaporating the film-forming material from the evaporation surface of said cathode and ionizing the same, and depositing the ionized film-forming substance on the surface of a substrate disposed in the vacuum chamber, wherein said shield has an edge shield protruded radially inward from the upper edge for covering an upper circumferential edge of the evaporation surface of said cathode.

12. A cathodic arc deposition system adapted to evaporate and ionize a cathode substance from an evaporation surface of a cathode comprising a film-forming material by means of arc discharge and ionize the same and deposit the ionized cathode substance on the surface of a substrate, comprising:
an arc evaporation source including said cathode,
a trigger electrode for restarting the arc when the arc is stopped,
a cylindrical shield surrounding a circumferential side of the cathode with a gap therebetween, wherein an axial line of the shield is aligned with an axial line of said cathode and disposed such that the upper edge thereof is substantially at an identical height with that of the evaporation surface of said cathode,
a detection device that detects the number of arc stops per hour of said arc discharge and outputs a cathode evaporation surface retraction detection signal when the arc stop number reaches a predetermined number, and
a moving mechanism for moving at least one of said cathode and said shield in response to said cathode evaporation surface retraction detection signal and by a predetermined distance in a direction of decreasing a difference of height between the evaporation surface of said cathode and the upper edge of said shield.

13. A method of controlling a cathodic arc deposition system comprising a cathode comprising a film-forming material, a shield surrounding the circumferential side of said cathode with a gap therebetween and a vacuum chamber having said cathode and said shield disposed therein, and adapted for depositing an ionized cathode substance on the surface of a substrate by evaporating the cathode substance from an evaporation surface of said cathode via arc discharge in the vacuum chamber, comprising:
a step of detecting the number of arc stops,
a step of outputting a cathode evaporation surface retraction detection signal Z when the detected arc stop number reaches a predetermined number, and
a step of adjusting the height of an upper edge of said shield so as to be identical with the height of an evaporation surface of said cathode based on said cathode evaporation surface retraction detection signal.

* * * * *